United States Patent
Bachmann et al.

(10) Patent No.: US 10,424,898 B2
(45) Date of Patent: Sep. 24, 2019

(54) SEMICONDUCTOR LASER DIODE

(71) Applicant: OSRAM Opto Semiconductors GmbH, Regensburg (DE)

(72) Inventors: Alexander Bachmann, Ismaning (DE); Christian Lauer, Regensburg (DE); Michael Furitsch, Ascha (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/774,417

(22) PCT Filed: Nov. 8, 2016

(86) PCT No.: PCT/EP2016/076986
§ 371 (c)(1),
(2) Date: May 8, 2018

(87) PCT Pub. No.: WO2017/081010
PCT Pub. Date: May 18, 2017

(65) Prior Publication Data
US 2018/0331502 A1    Nov. 15, 2018

(30) Foreign Application Priority Data
Nov. 9, 2015   (DE) .................. 10 2015 119 226

(51) Int. Cl.
*H01S 5/20*    (2006.01)
*H01S 5/042*   (2006.01)
(Continued)

(52) U.S. Cl.
CPC .......... *H01S 5/2036* (2013.01); *G02B 6/4292* (2013.01); *H01S 5/0282* (2013.01);
(Continued)

(58) Field of Classification Search
CPC ............... H01S 5/2036; H01S 5/34306; H01S 5/34313; H01S 5/0282; H01S 5/22; G02B 6/4292
See application file for complete search history.

(56) References Cited

U.S. PATENT DOCUMENTS

| 5,561,680 A | 10/1996 | Haberern |
| 2003/0179795 A1 | 9/2003 | Moriya et al. |
| 2008/0205466 A1 | 8/2008 | Verma et al. |

FOREIGN PATENT DOCUMENTS

| CN | 104332823 A | 2/2015 |
| DE | 10 2011 055 891 A1 | 6/2013 |

(Continued)

OTHER PUBLICATIONS

M. Buda et al., "Stress-Induced Effects by the Anodic Oxide in Ridge Waveguide Laser Diodes," IEEE Journal of Quantum Electronics, vol. 36, No. 10, Oct. 2000, pp. 1174-1183.*

(Continued)

*Primary Examiner* — Xinning (Tom) Niu
(74) *Attorney, Agent, or Firm* — DLA Piper LLP (US)

(57) ABSTRACT

A semiconductor laser diode includes a layer sequence including a plurality of layers arranged one above another in a growth direction, wherein the semiconductor laser diode includes a first facet and a second facet between which a resonator extending in a longitudinal direction is formed, the layer sequence includes an active layer in which an active region is formed, the layer sequence includes waveguide layers, and the layer sequence includes a stressed layer arranged above the active layer in the growth direction, the stressed layer being provided for influencing a refractive index profile in the waveguide layers at least to partly compensate for an inhomogeneous variation of a refractive index in the waveguide layers, the inhomogeneous variation (Continued)

being brought about by an inhomogeneous temperature distribution during operation of the semiconductor laser diode.

17 Claims, 13 Drawing Sheets

(51) Int. Cl.
*H01S 5/32* (2006.01)
*G02B 6/42* (2006.01)
*H01S 5/028* (2006.01)
*H01S 5/22* (2006.01)
*H01S 5/343* (2006.01)

(52) U.S. Cl.
CPC .............. *H01S 5/0425* (2013.01); *H01S 5/22* (2013.01); *H01S 5/3201* (2013.01); *H01S 5/34306* (2013.01); *H01S 5/34313* (2013.01); *H01S 2301/18* (2013.01)

(56) References Cited

FOREIGN PATENT DOCUMENTS

| DE | 102011055891 A | * | 6/2013 | ............ H01S 5/024 |
|----|----------------|---|--------|---------------------|
| EP | 1 347 548 A2 | | 9/2003 | |
| EP | 1 906 498 A1 | | 4/2008 | |
| JP | H11-511908 A | | 10/1999 | |
| JP | 2002-329926 A | | 11/2002 | |
| JP | 2003-163415 A | | 6/2003 | |
| WO | 2013/079346 A1 | | 6/2013 | |

OTHER PUBLICATIONS

M. Buda et al., "Stress-Induced Effects by the Anodic Oxide in Ridge Waveguide Laser Diodes," IEEE Journal of Quantum Electronics, vol. 36, No. 10, Oct. 2000, pp. 1174-1183. (Year: 2000).*
P.A. Kirby et al., "Photoelastic waveguides and their effect on stripe-geometry GaAs/Ga$_{1-x}$Al$_x$As lasers," Journal of Applied Physics, vol. 50, No. 7, Jun. 1, 1979, pp. 4567-4569 (Abstract).
Notice of Reasons for Rejection dated Apr. 2, 2019, of counterpart Japanese Application No. 2018-521618, along with an English translation.

* cited by examiner

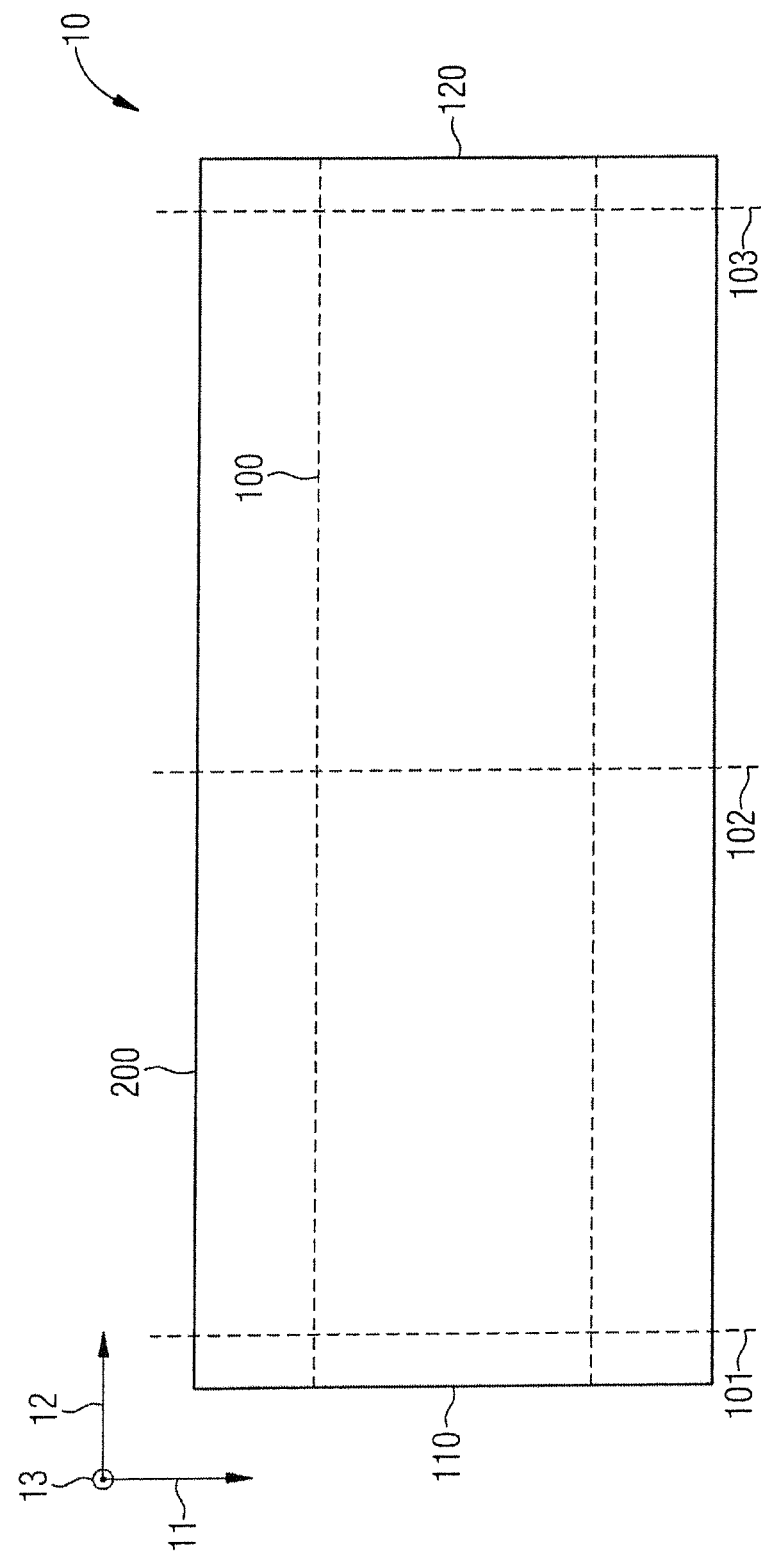

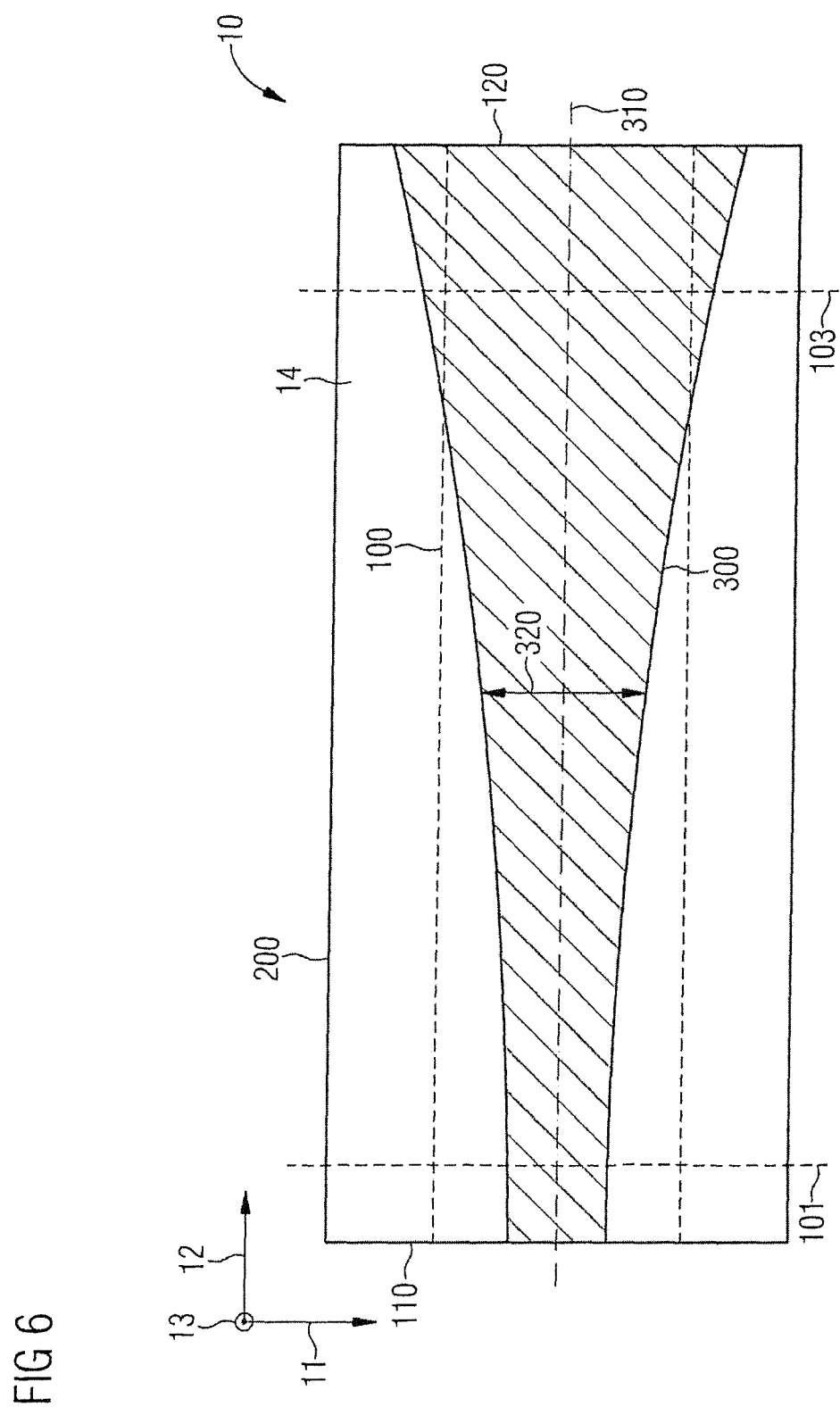

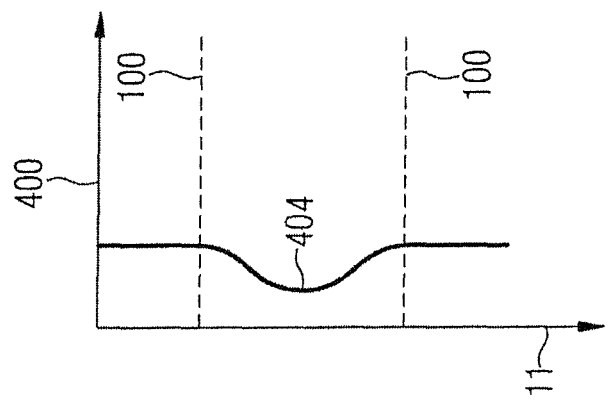
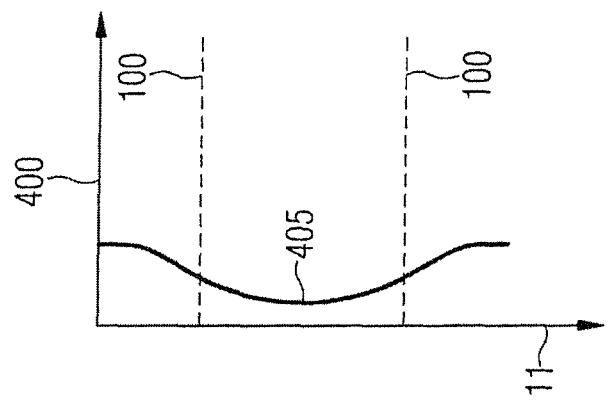

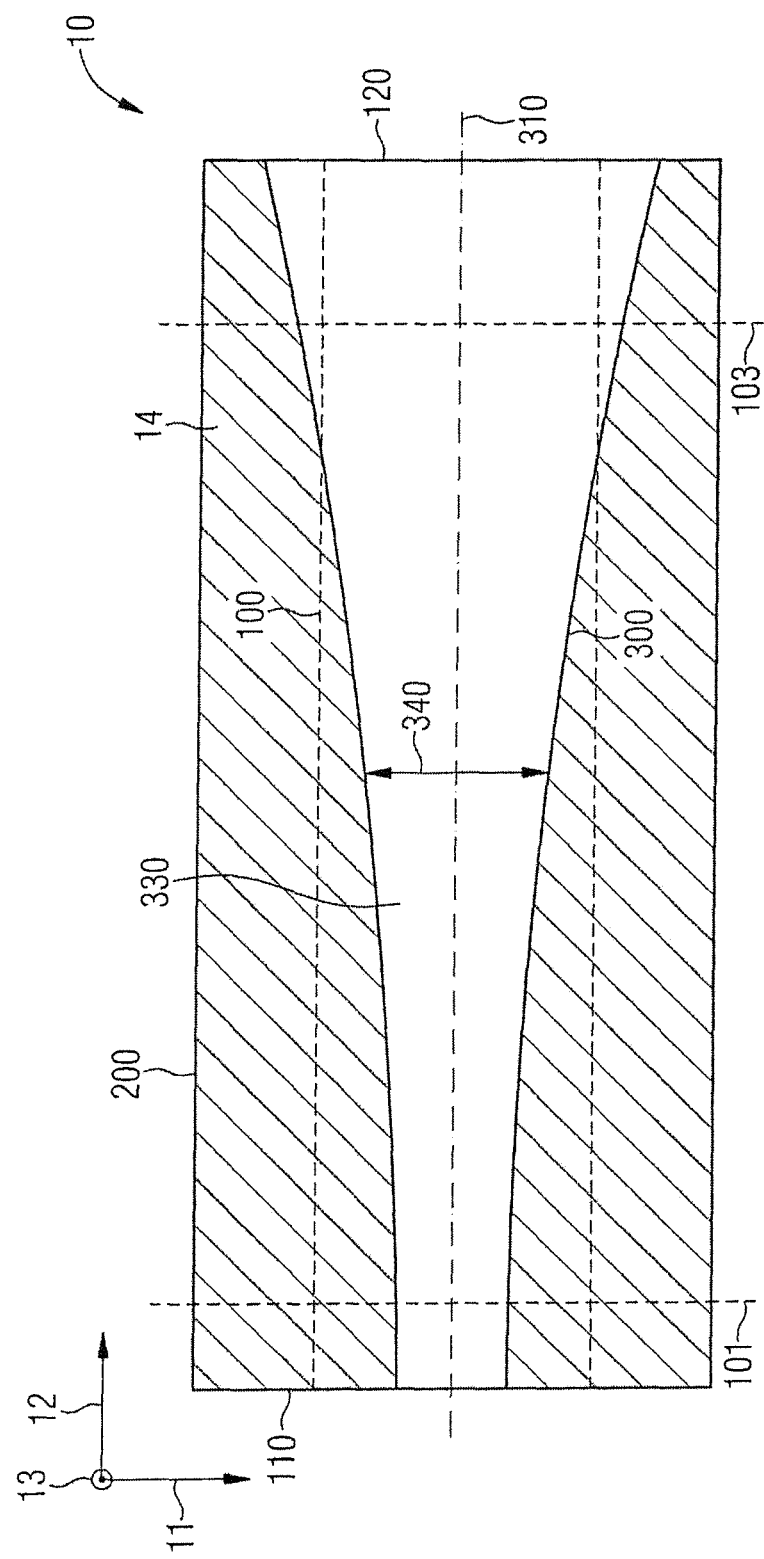

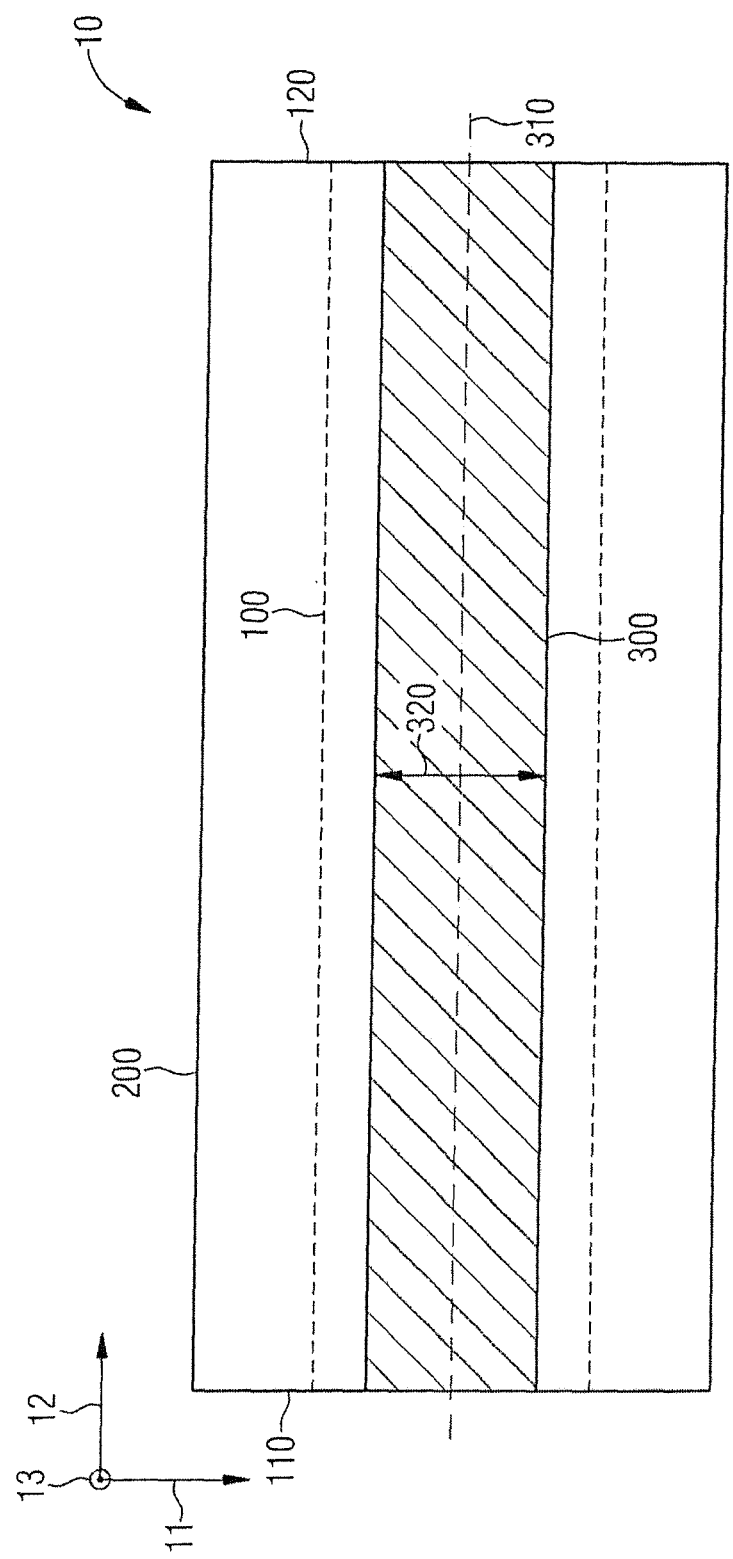

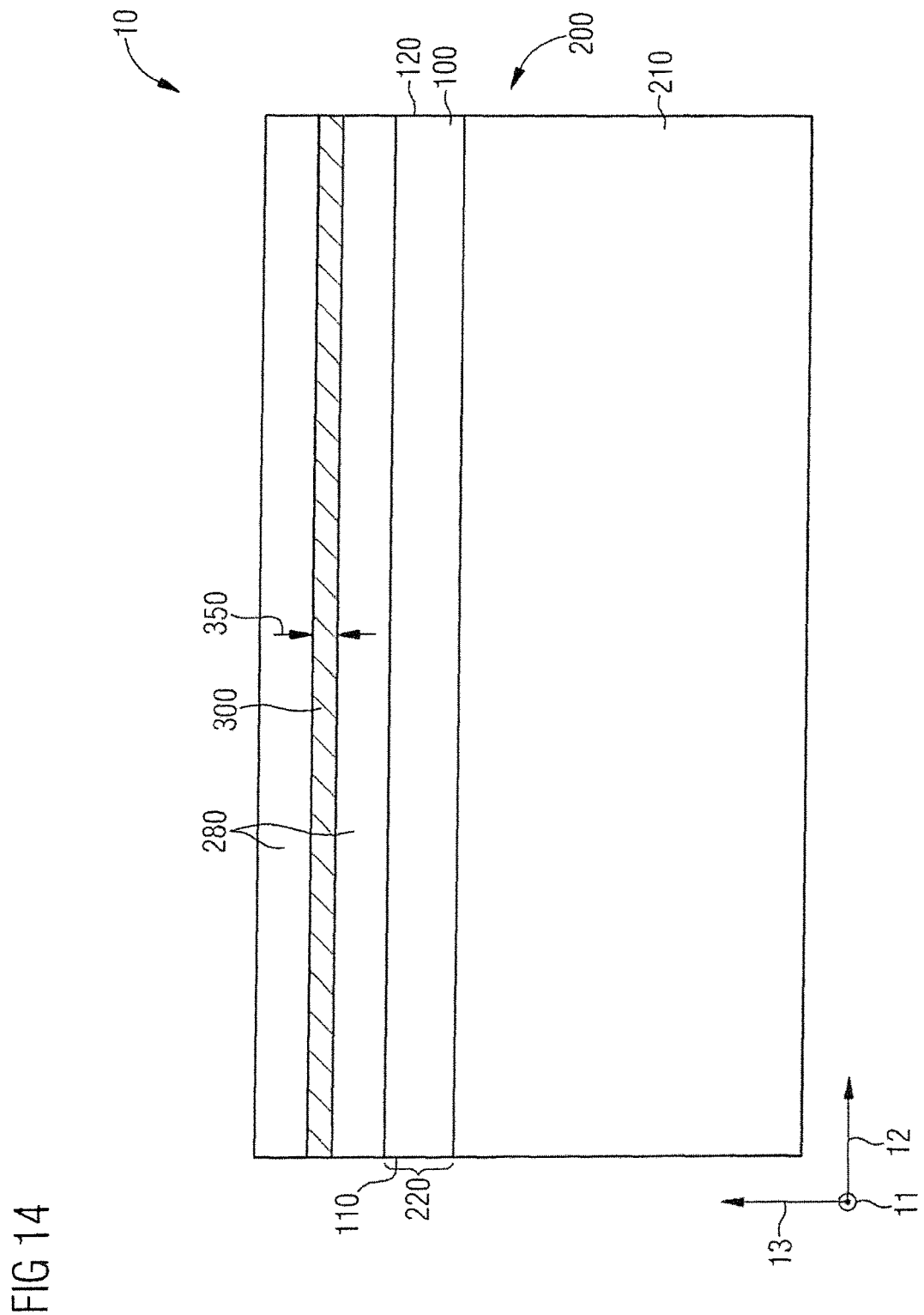

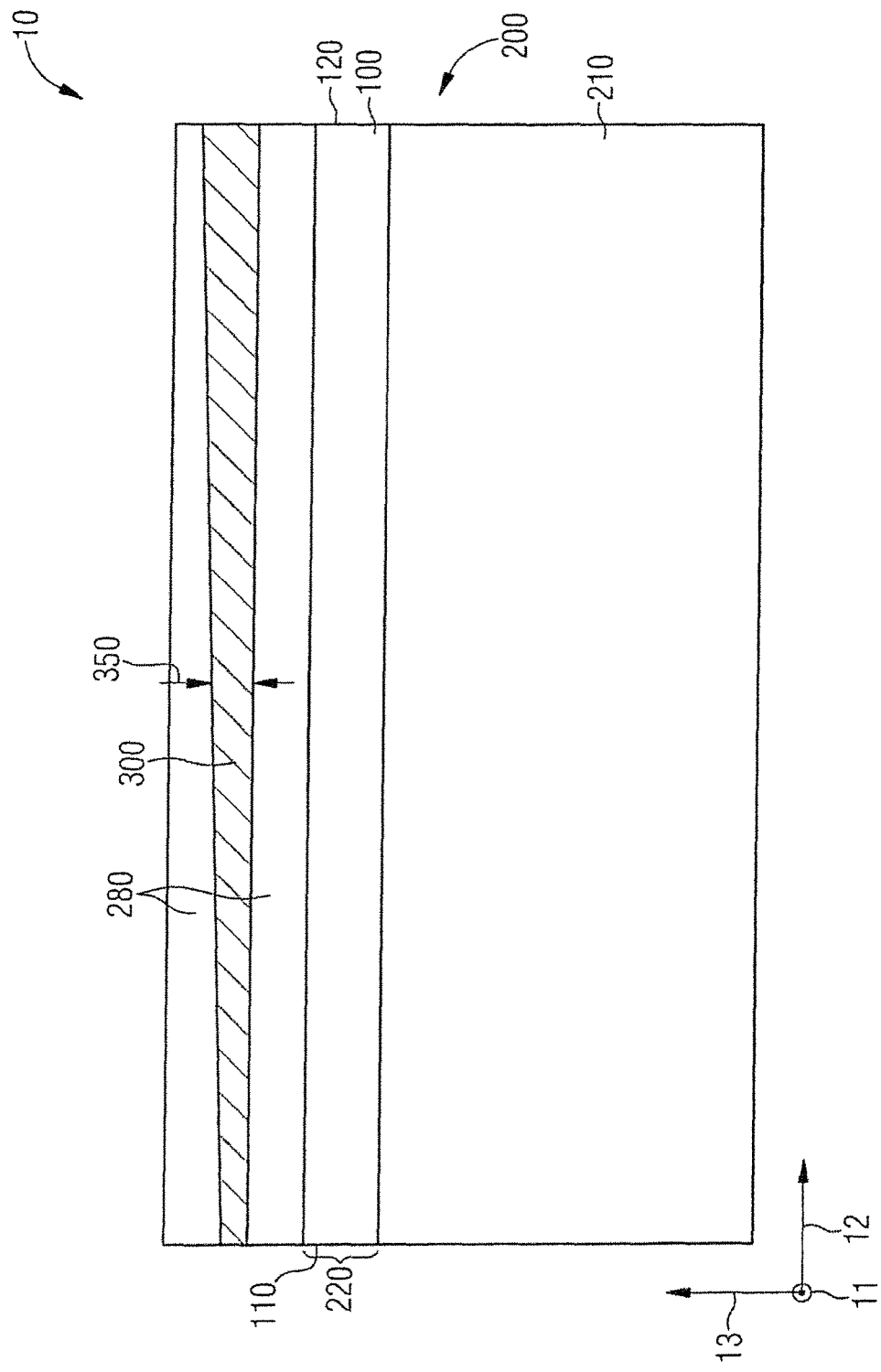

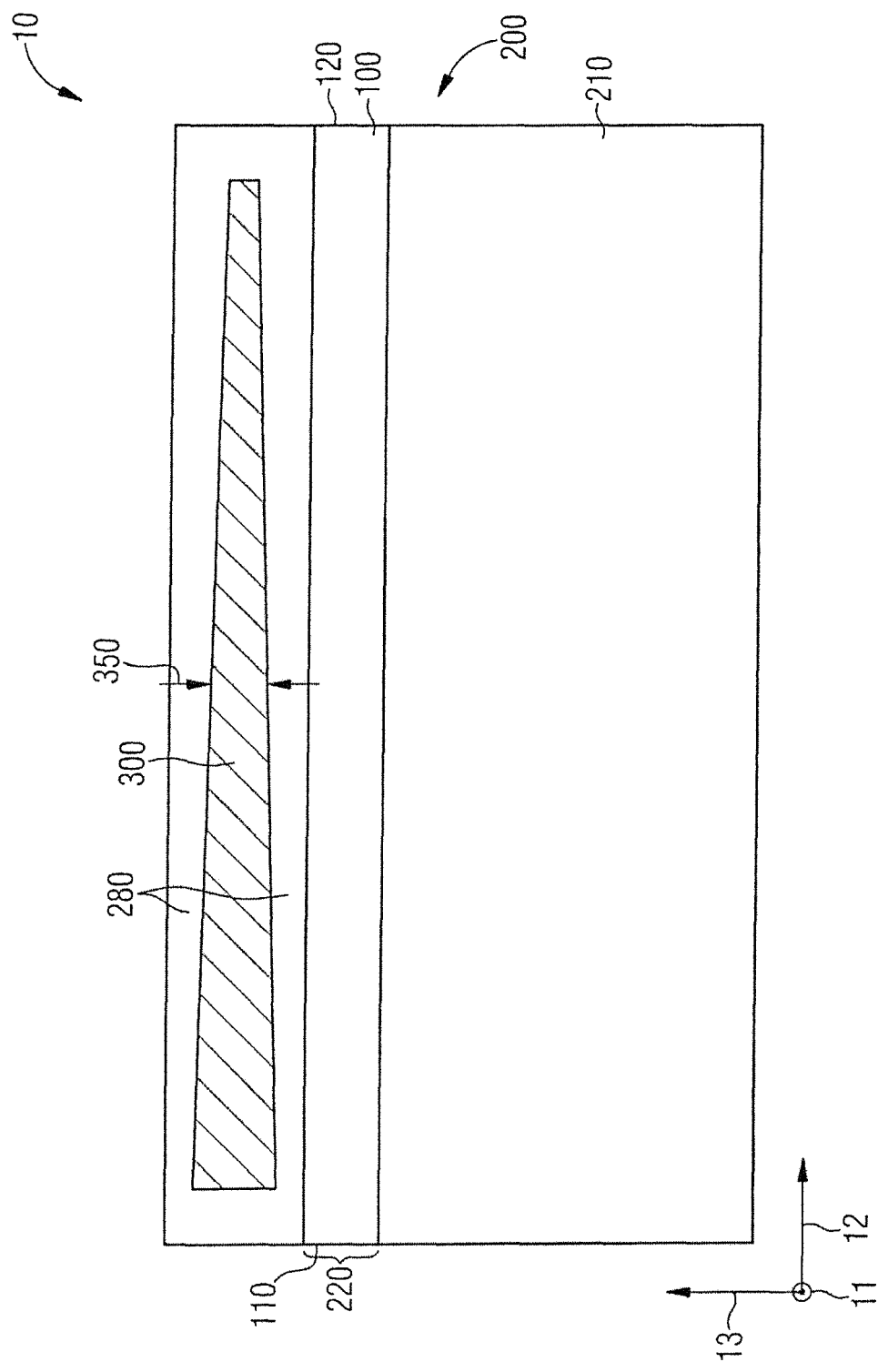

SEMICONDUCTOR LASER DIODE

TECHNICAL FIELD

This disclosure relates to a semiconductor laser diode.

BACKGROUND

It is known that in semiconductor laser diodes heating of the resonator that is inhomogeneous in a lateral direction may lead to a lateral refractive index profile that brings about a lens effect that disadvantageously influences the beam quality. This effect is referred to as a thermal lens.

SUMMARY

We provide a semiconductor laser diode including a layer sequence including a plurality of layers arranged one above another in a growth direction, wherein the semiconductor laser diode includes a first facet and a second facet between which a resonator extending in a longitudinal direction is formed, the layer sequence includes an active layer in which an active region is formed, the layer sequence includes waveguide layers, and the layer sequence includes a stressed layer arranged above the active layer in the growth direction, the stressed layer being provided for influencing a refractive index profile in the waveguide layers at least to partly compensate for an inhomogeneous variation of a refractive index in the waveguide layers, the inhomogeneous variation being brought about by an inhomogeneous temperature distribution during operation of the semiconductor laser diode.

BRIEF DESCRIPTION OF THE DRAWINGS

FIG. 2 shows a schematic plan view of the layer sequence of the semiconductor laser diode.

FIG. 6 schematically shows a plan view of a stressed layer of the layer sequence in accordance with a first example.

FIGS. 7 and 8 schematically show refractive index profiles brought about by the stressed layer in the resonator formed in the layer sequence.

FIG. 9 schematically shows a plan view of the stressed layer in accordance with a second example.

FIG. 10 schematically shows a plan view of the stressed layer in accordance with a third example.

FIG. 14 schematically shows a sectional side view of the layer sequence in accordance with a seventh example.

FIG. 15 schematically shows a sectional side view of the layer sequence in accordance with an eighth example.

FIG. 16 schematically shows a sectional side view of the layer sequence in accordance with a ninth example.

LIST OF REFERENCE SIGNS

Figure 1:
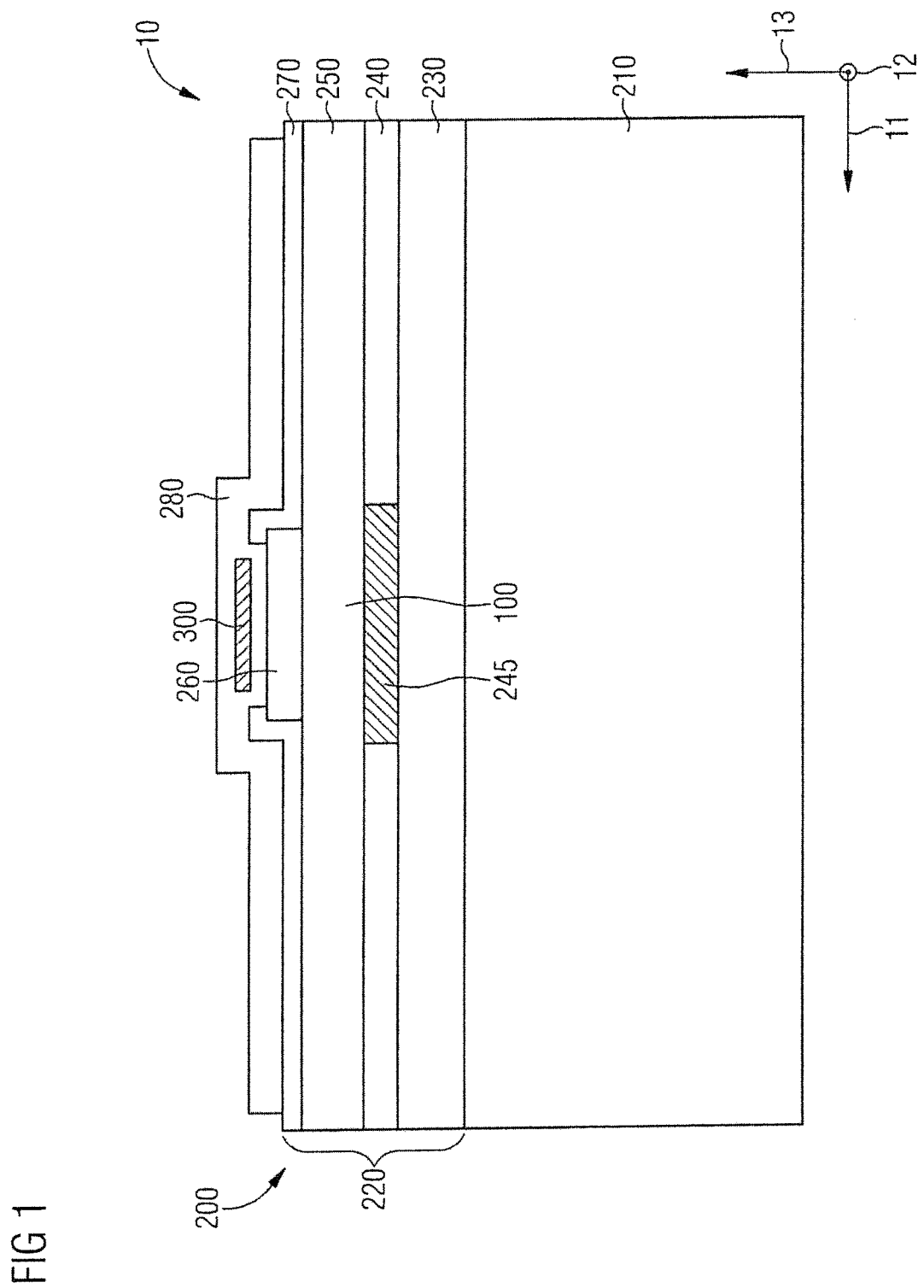
FIG. 1 schematically shows a sectional side view of a layer sequence of a semiconductor laser diode.

10 Semiconductor laser diode
11 Transverse direction
12 longitudinal direction
13 growth direction
14 lateral plane
100 Resonator
101 first position
102 second position
103 third position
110 Mirror facet
120 Coupling-out facet
200 Layer sequence
210 Substrate
220 Epitaxial layers
230 first semiconductor layer
240 active layer
245 active region
250 second semiconductor layer
260 Semiconductor cover layer
270 Passivation layer
280 Metallization layer
300 stressed layer
310 Axis of symmetry
320 Width of the stressed layer
330 Cutout
340 Width of the cutout
350 Thickness
400 Refractive index
401 first refractive index profile
402 second refractive index profile
403 third refractive index profile
404 fourth refractive index profile
405 fifth refractive index profile

DETAILED DESCRIPTION

Our semiconductor laser diode comprises a layer sequence comprising a plurality of layers arranged one above another in a growth direction. The semiconductor laser diode comprises a first facet and a second facet between which a resonator extending in a longitudinal direction is formed. The layer sequence comprises an active layer in which an active region is formed. The layer sequence comprises a stressed layer arranged above the active layer in the growth direction.

The stressed layer arranged above the active layer brings about an influencing of the spatial profile of the refractive index in the resonator. As a result, the stressed layer may reduce or compensate for a thermal lens effect appearing in the semiconductor laser diode. As a result, a laser beam emitted by the semiconductor laser diode may advantageously comprise a high beam quality comprising little beam divergence.

The layer sequence comprises waveguide layers. In this case, the stressed layer influences a refractive index profile in the waveguide layers to at least partly compensate for an inhomogeneous variation of a refractive index in the waveguide layers, the inhomogeneous variation being brought about by an inhomogeneous temperature distribution during operation of the semiconductor laser diode. Experience shows that a refractive index gradient established in the waveguide layers as a result of non-uniform heating brings about a particularly great thermal lens effect. Advantageously, an influencing of the refractive index profile in the waveguide layers, the influencing being brought about by the stressed layer, may thereby bring about a particularly significant improvement in the beam quality of a laser beam emitted by the semiconductor laser diode.

The stressed layer may be structured in a lateral plane perpendicular to the growth direction. Advantageously, the stressed layer may thereby bring about an influencing of a refractive index profile in a lateral direction.

The stressed layer may be centered above the active region in a transverse direction perpendicular to the growth direction and the longitudinal direction. What may advantageously be achieved thereby is that the stressed layer brings about an influencing of the refractive index in the waveguide layers, which influencing is symmetrical with respect to an axis of symmetry of the resonator.

The stressed layer may be formed symmetrically with respect to an axis of symmetry parallel to the longitudinal direction. What may advantageously be achieved thereby is that the stressed layer brings about an influencing of the refractive index in the layer sequence of the semiconductor laser diode, which influencing is symmetrical with respect to the axis of symmetry.

The stressed layer may be tensile-stressed.

The stressed layer may comprise, in a transverse direction perpendicular to the growth direction and the longitudinal direction, a width that changes in the longitudinal direction. A thermal lens effect resulting from a temperature profile in the layer sequence of the semiconductor laser diode, which temperature profile is variable in the longitudinal direction, may advantageously be attenuated as a result.

The width of the stressed layer may increase in the direction toward the second facet. A thermal lens effect of a temperature increasing in the direction toward the second facet in the layer sequence of the semiconductor laser diode may advantageously be reduced or compensated for as a result.

The stressed layer may be compressively stressed. In this case, the stressed layer comprises a cutout arranged above the active region in the growth direction. Advantageously, the stressed layer may thereby bring about an influencing of the refractive index profile in the vicinity of the active region.

The cutout may comprise, in a transverse direction perpendicular to the growth direction and the longitudinal direction, a width that changes in the longitudinal direction. Advantageously, the stressed layer may thereby reduce or compensate for a refractive index gradient brought about by a temperature that is variable in the longitudinal direction in the layer sequence.

The width of the cutout may increase in the direction toward the second facet. Advantageously, the stressed layer may then reduce or compensate for a thermal lens effect resulting from a temperature in the layer sequence of the semiconductor laser diode, the temperature increasing in the direction toward the second facet.

A thickness of the stressed layer as measured in the growth direction may change in the longitudinal direction. Advantageously, this also makes it possible for the stressed layer to reduce or compensate for a thermal lens effect resulting from a temperature profile that is variable in the longitudinal direction in the layer sequence of the semiconductor laser diode.

The stressed layer may extend in the longitudinal direction as far as the first facet and/or as far as the second facet. Advantageously, the stressed layer may thereby influence a refractive index profile in the layer sequence as far as the first facet and/or as far as the second facet.

The stressed layer may extend in the longitudinal direction not as far as the first facet and/or not as far as the second facet. Advantageously, the semiconductor laser diode may thereby be producible in a simple manner. Moreover, spacing apart the stressed layer from the first facet and/or the second facet advantageously makes it possible to avoid disadvantageous influencings of the first facet and/or of the second facet by the stressed layer.

The stressed layer may be arranged above a metallization layer in the growth direction. Advantageously, the stressed layer may thereby be applied in a particularly simple manner. Moreover, this makes it possible to introduce an electric pump current into the layer sequence of the semiconductor laser diode below the stressed layer.

A metallization layer may be arranged above the stressed layer in the growth direction. The metallization layer arranged above the stressed layer may allow the semiconductor laser diode to be electrically contacted. The stressed layer may be embedded, for example, between a plurality of metallization layers.

The stressed layer may comprise an electrically conductive material. Advantageously, as a result the stressed layer does not impair an electrical contactability of the semiconductor laser diode.

The above-described properties, features and advantages and the way in which they are achieved will become clearer and more clearly understood in association with the following description of examples explained in greater detail in association with the drawings.

FIG. 1 shows a schematic sectional side view of a semiconductor laser diode 10. The semiconductor laser diode may be, for example, a high-power laser diode for fiber coupling applications, in particular, for example, a semiconductor laser diode that may be used for pumping a fiber laser.

The semiconductor laser diode 10 comprises a layer sequence 200 arranged above a substrate 210. The layer sequence 200 comprises a plurality of layers arranged one above another in a growth direction 13.

The layer sequence 200 of the semiconductor laser diode 10 comprises a number of epitaxial layers 220 that have been grown epitaxially onto the substrate 210. In the example shown schematically in FIG. 1, the epitaxial layers 220 comprise a first semiconductor layer 230 arranged nearer to the substrate 210, and a second semiconductor layer 250 further away from the substrate 210. The first semiconductor layer 230 and the second semiconductor layer 250 may be formed in each case by a plurality of sublayers and comprise, for example, waveguide and/or cladding layers. An active layer 240 is arranged between the first semiconductor layer 230 and the second semiconductor layer 250, the active layer likewise being formed as a semiconductor layer. The active layer 240 may also be formed by a plurality of sublayers.

A semiconductor cover layer 260 is arranged above the second semiconductor layer 250 in the growth direction 13. The semiconductor cover layer 260 is structured in a plane perpendicular to the growth direction 13, that is to say extends only over a part of the second semiconductor layer 250 in the plane perpendicular to the growth direction 13. The semiconductor cover layer 260 comprises a limited width in a transverse direction 11 perpendicular to the growth direction 13.

FIG. 2 shows a plan view of the layer sequence 200 of the semiconductor laser diode 10 in a schematic illustration. The semiconductor laser diode 10 comprises a mirror facet 110 oriented parallel to the growth direction 13 and parallel to the transverse direction 11. Moreover, the semiconductor laser diode 10 comprises a coupling-out facet 120 parallel to the mirror facet 110 and situated opposite the mirror facet 110. During operation of the semiconductor laser diode 10, a laser beam is emitted at the coupling-out facet 120.

It is possible to provide a coupling-out facet instead of the mirror facet 110 also at this side of the semiconductor laser diode 10 such that laser radiation may be coupled out at both facets of the semiconductor laser diode 10. At all events the semiconductor laser diode comprises a first facet and a second facet situated opposite the first facet.

Below the semiconductor cover layer 260 in the growth direction 13, a resonator 100 is formed in the first semiconductor layer 230, the active layer 240 and the second semiconductor layer 250 of the layer sequence 200. The resonator 100 extends along a longitudinal direction 12 perpendicular to the transverse direction 11 and to the growth direction 13, the longitudinal direction being oriented perpendicular to the mirror facet 110 and to the coupling-out facet 120, between the mirror facet 110 and the coupling-out facet 120. In the transverse direction 11, the resonator 100 comprises a limited width substantially predefined by the width of the semiconductor cover layer 260 in the transverse direction 11.

FIG. 1 shows that the layer sequence 200 furthermore comprises a passivation layer 270 arranged in the growth direction 13, above the sections of the second semiconductor layer 250 not covered by the semiconductor cover layer 260. The passivation layer 270 may also extend in sections over the semiconductor cover layer 260, but comprises an opening in the region of the semiconductor cover layer 260. The passivation layer 270 is electrically insulating. The passivation layer 270 may be omitted.

A metallization layer 280 is arranged above the passivation layer 270 in the growth direction 13, the metallization layer being electrically connected to the semiconductor cover layer 260 in the region of the opening of the passivation layer 270.

The metallization layer 280 enables current to be introduced into the layer sequence 200 of the semiconductor laser diode 10, as a result of which an active region 245 is formed in the active layer 240 below the semiconductor cover layer 260 in the growth direction 13 during operation of the semiconductor laser diode 10. The active region 245 comprises, in the transverse direction 11, a limited width that is substantially defined by the width of the semiconductor cover layer 260 in the transverse direction 11. The width of the active region 245 in the transverse direction 11 may be 30 μm to 300 μm, for example. In this case, the semiconductor laser diode 10 forms a broad-strip laser.

The layer sequence 200 heats up during the operation of the semiconductor laser diode 10. In this case, heating occurs in particular in the region of the resonator 100. Particularly great heating may arise in the region of the coupling-out facet 120. As a result, an inhomogeneous temperature distribution may be established in the layer sequence 200 during operation of the semiconductor laser diode 10. In this case, the temperature may decrease in particular, for example, counter to the longitudinal direction 12 from the coupling-out facet 120 to the mirror facet 110 and in and counter to the transverse direction 11 from the center of the resonator 100 to the sections of the layer sequence 200 arranged laterally alongside the resonator 100.

The inhomogeneous temperature distribution in the layer sequence 200 of the semiconductor laser diode 10 may bring about an inhomogeneous variation of the refractive index in the semiconductor layers 230, 240, 250 in the region of the resonator 100. This may be caused by a temperature dependence of the refractive index.

Figure 3:
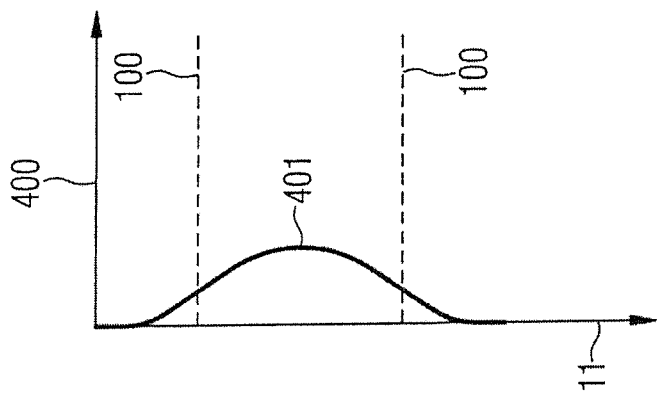

FIG. 3 shows, in a schematic illustration, a first refractive index profile 401 in the region of the resonator 100 at a first longitudinal position 101, which is marked in FIG. 2 and which is near to the mirror facet 110. In FIG. 3, the transverse direction 11 is represented on a horizontal axis, the approximate lateral boundaries of the resonator 100 being marked schematically. A refractive index 400 is plotted on a vertical axis in FIG. 3. The first refractive index profile 401 shows the spatial profile of the refractive index 400 which is established in the semiconductor layers 230, 240, 250 of the layer sequence 200 of the semiconductor laser diode 10 during the operation of the semiconductor laser diode 10. The first refractive index profile 401 may also be referred to as profile in respect of refractive index. It is evident that the refractive index 400 in the region of the center of the resonator 100 comprises a value that differs from the value of the refractive index 400 near to the lateral boundaries of the resonator 100 in the transverse direction 11. In the example illustrated, the refractive index 400 in the center of the resonator 100 is higher than that at the sides of the resonator 100.

Figure 4:
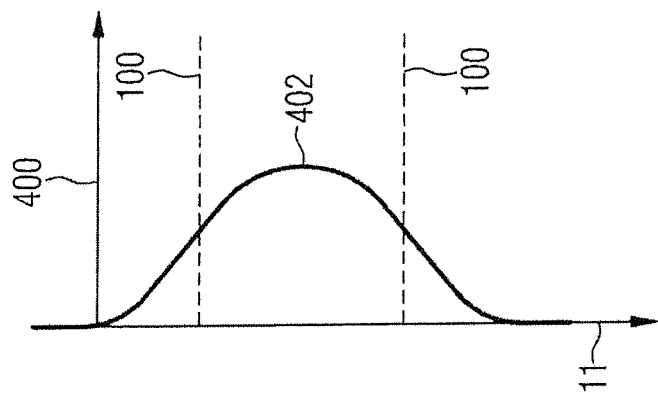

FIG. 4 shows, in a schematic illustration, a second refractive index profile 402 established in the semiconductor layers 230, 240, 250 of the layer sequence 200 of the semiconductor laser diode 10 at a second longitudinal position 102 during the operation of the semiconductor laser diode 10, the second longitudinal position arranged approximately centrally between the mirror facet 110 and the coupling-out facet 120. Once again, the transverse direction 11 is plotted on a horizontal axis and the refractive index 400 is plotted on a vertical axis. In the second refractive index profile 402, too, the refractive index 400 in the center of the resonator 100 comprises a different, in the example higher, value than that in the side regions of the resonator 100. In this case, the value of the refractive index 400 in the center of the resonator 100 in the second refractive index profile 402 is greater than that in the first refractive index profile 401.

Figure 5:
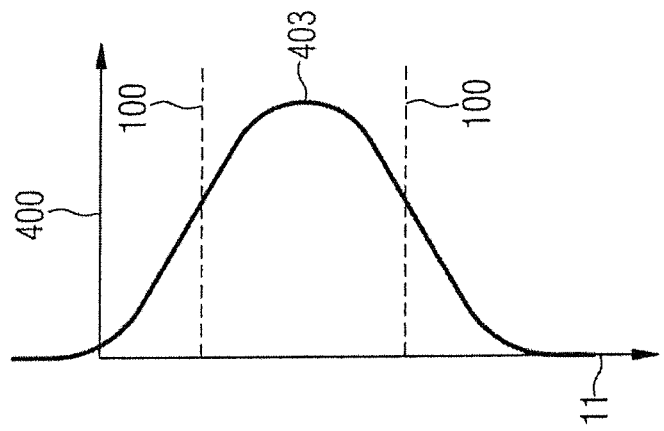
FIGS. 3, 4 and 5 schematically show refractive index profiles at different positions in a resonator formed in the layer sequence.

FIG. 5 shows, in a schematic illustration, a third refractive index profile 403 established in the semiconductor layers 230, 240, 250 of the layer sequence 200 at a third longitudinal position 103 during operation of the semiconductor laser diode 10, the third longitudinal position arranged near the coupling-out facet 120 of the semiconductor laser diode 10. In FIG. 5, too, the transverse direction 11 is plotted on a horizontal axis and the refractive index 400 is plotted on a vertical axis. In the third refractive index profile 403, too, the refractive index 400 in the center of the resonator 100 differs from the values near the sides of the resonator 100. In this case, the refractive index 400 in the third refractive index profile 403 in the center of the resonator 100 comprises an even greater value than that in the second refractive index profile 402.

Consequently, the refractive index 400 in the semiconductor layers 230, 240, 250 of the layer sequence 200 in the region of the resonator 100 is variable in the transverse direction 11 during operation of the semiconductor laser diode 10. In addition, the value of the refractive index 400 in the semiconductor layers 230, 240, 250 of the layer sequence 200 in the region of the resonator 100 is also variable in the longitudinal direction 12.

The variation of the refractive index 400 in the semiconductor layers 230, 240, 250 of the layer sequence 200 may result in a thermal lens effect and thereby adversely influence a beam quality of the laser beam coupled out from the resonator 100 of the semiconductor laser diode 10 at the coupling-out facet 120.

FIG. 1 shows that the layer sequence 200 of the semiconductor laser diode 10 comprises a stressed layer 300 arranged above the active layer 240 in the growth direction 13. The stressed layer 300 is provided to influence the refractive index profile in the semiconductor layers 230, 240, 250 at least partly to compensate for an inhomogeneous variation of the refractive index 400 in the semiconductor layers 230, 240, 250, the inhomogeneous variation being brought about by an inhomogeneous temperature distribution during operation of the semiconductor laser diode 10. The influencing of the refractive index profile by the stressed layer 300 may be brought about via the photoelastic effect. For this purpose, the stressed layer 300 is stressed relative to the substrate 210 and the epitaxial layers 220 of the layer sequence 200 of the semiconductor laser diode 10.

The stressed layer 300 is structured in a lateral plane 14 perpendicular to the growth direction 13. FIG. 6 shows a plane view of the stressed layer 300 in accordance with a first example. The stressed layer 300 is tensile-stressed in this example. The stressed layer 300 is structured in the lateral plane 14 such that the stressed layer 300 is arranged only above a partial region of the active layer 240. In this case, the stressed layer 300 is centered above the active region 245 in the transverse direction 11. The stressed layer 300 is formed symmetrically with respect to an axis of symmetry 310 parallel to the longitudinal direction 12.

The structured stressed layer 300 comprises a width 320 in the transverse direction 11. The width 320 of the stressed layer 300 changes along the longitudinal direction 12. In the example shown in FIG. 6, the width 320 of the stressed layer 300 increases in the longitudinal direction 12 from the mirror facet 110 in the direction toward the coupling-out facet 120. In this case, the width 320 of the stressed layer 300 near the mirror facet 110 is smaller than a width of the resonator 100 in the transverse direction 11, while the width 320 of the stressed layer 300 near the coupling-out facet 120 is greater than the width of the resonator 100 in the transverse direction 11. In the example shown in FIG. 6, the width 320 of the stressed layer 300 increases more greatly than linearly along the longitudinal direction 12.

FIG. 7 shows a schematic illustration of a fourth refractive index profile 404 established in the waveguide layers 230, 240, 250 of the layer sequence 200 of the semiconductor laser diode 10 as a result of the influence of the stressed layer 300 at the first longitudinal position 101 of the resonator 100. As in FIGS. 3 to 5 the transverse direction 11 is plotted on a horizontal axis and the refractive index 400 is plotted on a vertical axis. The stressed layer 300 brings about a change in the refractive index 400 in the semiconductor layers 230, 240, 250 along the transverse direction 11. In this case, in the example illustrated the refractive index 400 in the center of the resonator 100 is lower than that in side regions of the resonator 100. The fourth refractive index profile 404 brought about by the stressed layer 300 is thus directed oppositely to the first refractive index profile 401 brought about by the inhomogeneous heating in FIG. 3 and is suitable for at least partly compensating for the first refractive index profile.

FIG. 8 shows, in a schematic illustration, a fifth refractive index profile 405 that results from the influence of the stressed layer 300 at the third longitudinal position 103 of the resonator 100 in the semiconductor layers 230, 240, 250 of the layer sequence 200 of the semiconductor laser diode 10. Once again, the transverse direction 11 is plotted on a horizontal axis and the refractive index 400 is plotted on a vertical axis. The fifth refractive index profile 405, too, comprises a decrease in the refractive index 400 in the direction toward the center of the resonator 100. In this case, however, the reduction of the refractive index 400 in the fifth refractive index profile 405 in the transverse direction 11 comprises a greater width than in the fourth refractive index profile 404. This stems from the fact that the stressed layer 300 comprises a greater width 320 at the third position 103 than at the first position 101. The fifth refractive index profile 405 is thereby suitable for at least partly compensating for the third refractive index profile 403 brought about by the inhomogeneous heating.

FIG. 9 shows a schematic plan view of the stressed layer 300 in accordance with a second example. In this Example, too, the stressed layer 300 is structured in the lateral plane 14 such that the stressed layer 300 is centered above the active region 245 in the transverse direction 11. In the second example of the stressed layer 300 as shown in FIG. 9, too, the stressed layer is formed symmetrically with respect to the axis of symmetry 310 parallel to the longitudinal direction 12.

In the second example of the stressed layer 300 as shown in FIG. 9, the stressed layer is compressively stressed. In this case, the stressed layer 300 comprises a cutout 330 arranged above the active region 245 in the growth direction 13 and is centered above the active region 245 in the transverse direction 11. The compressively stressed layer 300, comprising the cutout 330, of the second example shown in FIG. 9 brings about an influencing of the refractive index 400 in the waveguide layers 230, 240, 250 of the layer sequence 200 of the semiconductor laser diode 10 that substantially corresponds to the influencing of the refractive index 400 brought about by the first example of the stressed layer 300 as shown in FIG. 6.

The cutout 330 comprises a width 340 in the transverse direction 11. The width 340 of the cutout 330 changes in the longitudinal direction 12. In this case, the width 340 of the cutout 330 increases in the longitudinal direction 12 from the mirror facet 110 to the coupling-out facet 120. In the example shown in FIG. 9, the width 340 of the cutout 330 increases more greatly than linearly in the longitudinal direction 12. However, it is also possible for the width 340 of the cutout 330 to increase linearly or less than linearly in the longitudinal direction 12. It is likewise possible to form the stressed layer 300 such that the width 340 of the cutout 330 is constant or decreases from the mirror facet 110 to the coupling-out facet 120.

FIG. 10 shows, in a schematic illustration, a plan view of the stressed layer 300 of the semiconductor laser diode 10 in accordance with a third example. In the third example shown in FIG. 10, the stressed layer 300 is tensile-stressed and formed in a manner similar to the first example shown in FIG. 6. However, in the third example shown in FIG. 10, the width 320 of the stressed layer 300 is constant in the longitudinal direction 12. In this case, the width 320 of the stressed layer 300 is smaller than the width of the resonator 100 measured in the transverse direction 11.

Figure 11:
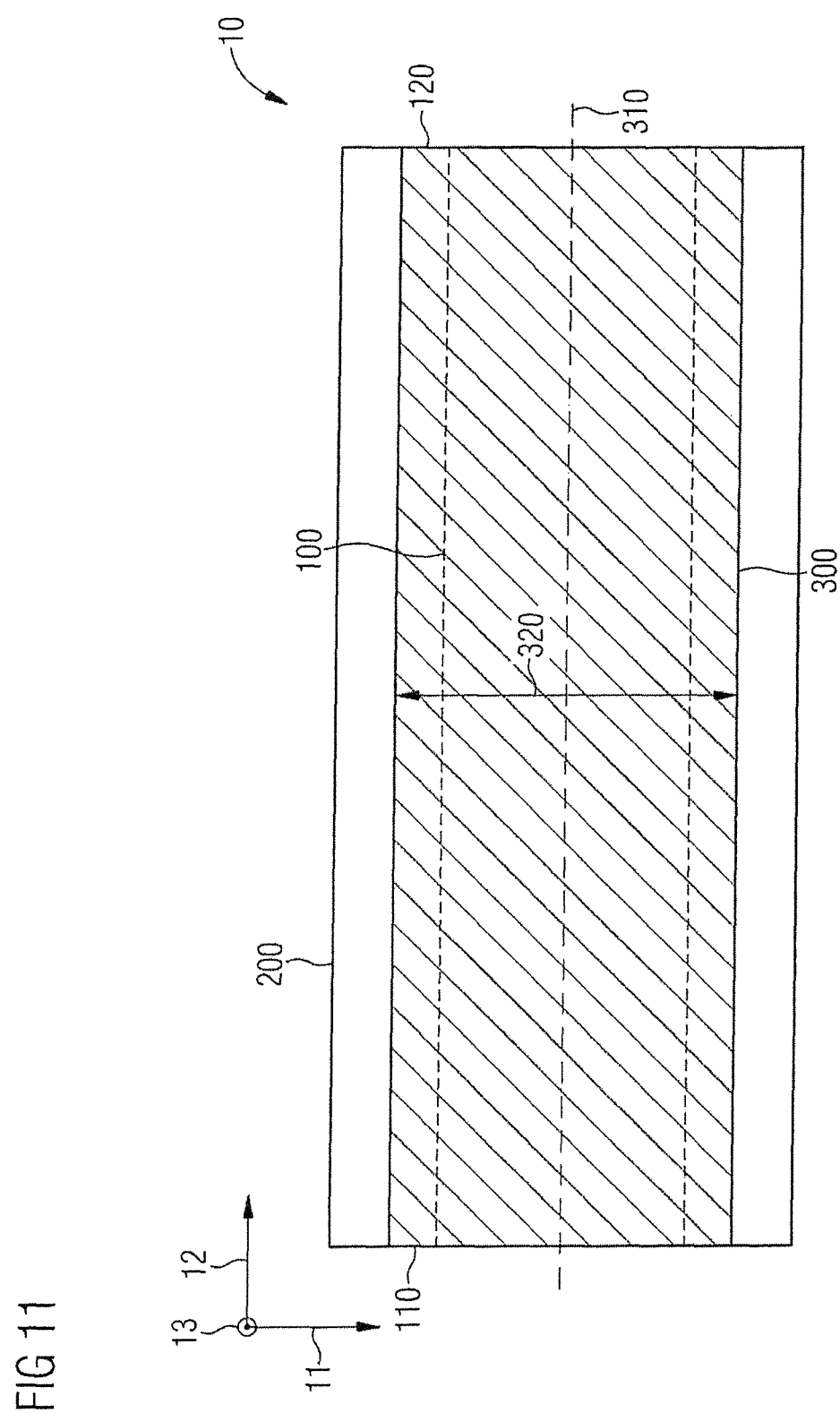
FIG. 11 schematically shows a plan view of the stressed layer in accordance with a fourth example.

FIG. 11 shows, in a schematic illustration, a plan view of the stressed layer 300 in accordance with a fourth example. In the fourth example, the stressed layer 300 is formed as in the third example shown in FIG. 10, but the width 320 of the stressed layer 300 is larger than the width of the resonator 100 measured in the transverse direction 11.

The examples of the stressed layer 300 as shown in FIGS. 10 and 11 are configured to at least partly compensate for a variation of the refractive index 400 in the semiconductor layers 230, 240, 250 of the layer sequence 200 in the transverse direction 11, the variation being brought about by an inhomogeneous temperature distribution. In this case, depending on the operating point of the semiconductor laser diode 10, the width 320 of the stressed layer 300 is adapted to result in an optimal compensation of the refractive index profile caused by an inhomogeneous temperature distribution.

Figure 12:
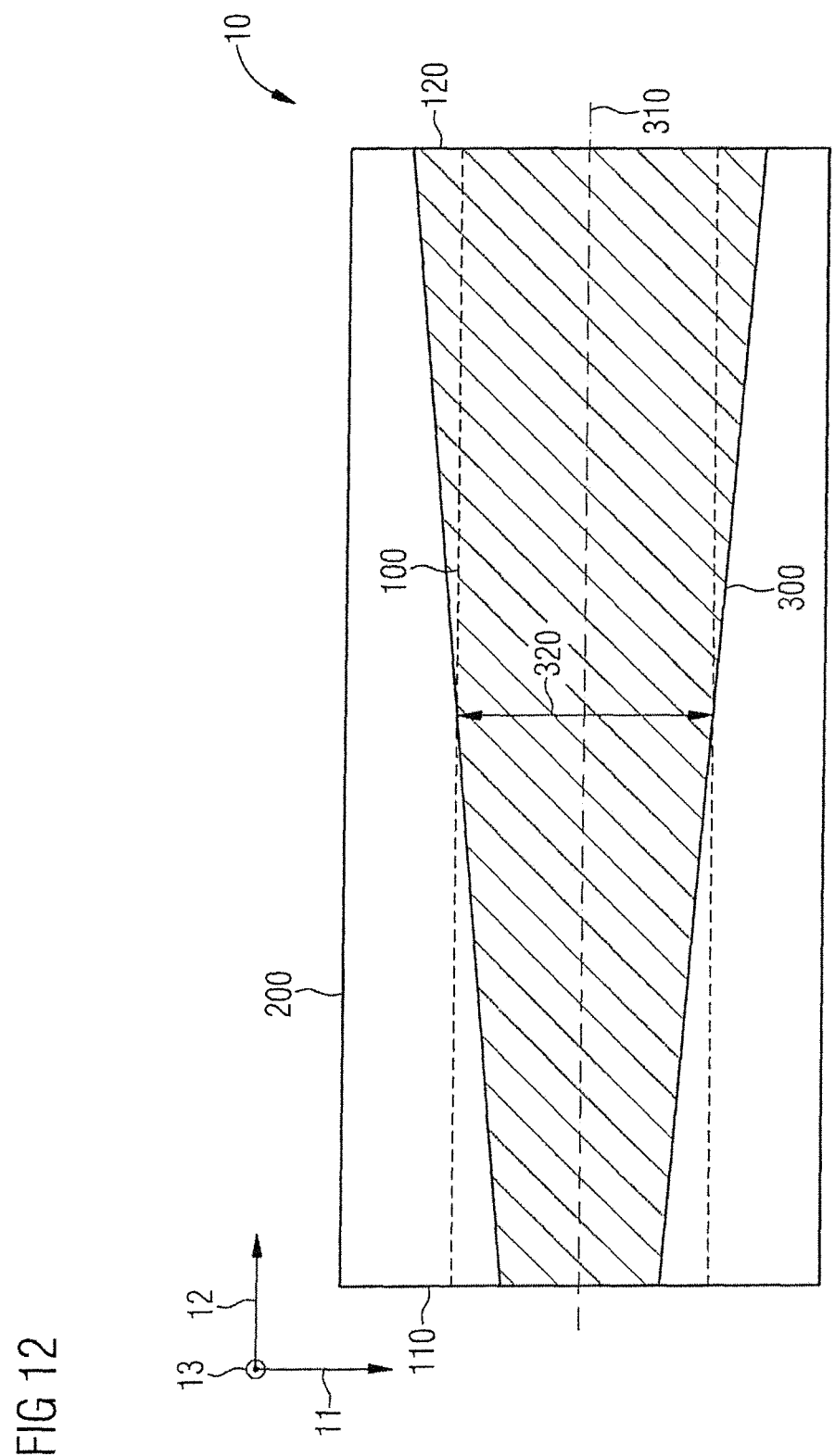
FIG. 12 schematically shows a plan view of the stressed layer in accordance with a fifth example.

FIG. 12 shows, in a schematic illustration, a plan view of the stressed layer 300 in accordance with a fifth example. In the fifth example, the stressed layer 300 is formed as in the first example shown in FIG. 6. However, the width 320 of the stressed layer 300 in the case of the fifth example shown in FIG. 12 increases linearly in the longitudinal direction 12. It is also possible to form the stressed layer 300 such that the width 320 increases less than linearly in the longitudinal direction 12.

In the first example shown in FIG. 6 and the fifth example shown in FIG. 12, the stressed layer 300 extends in the longitudinal direction 12 as far as the mirror facet 110 and as far as the coupling-out facet 120.

Figure 13:
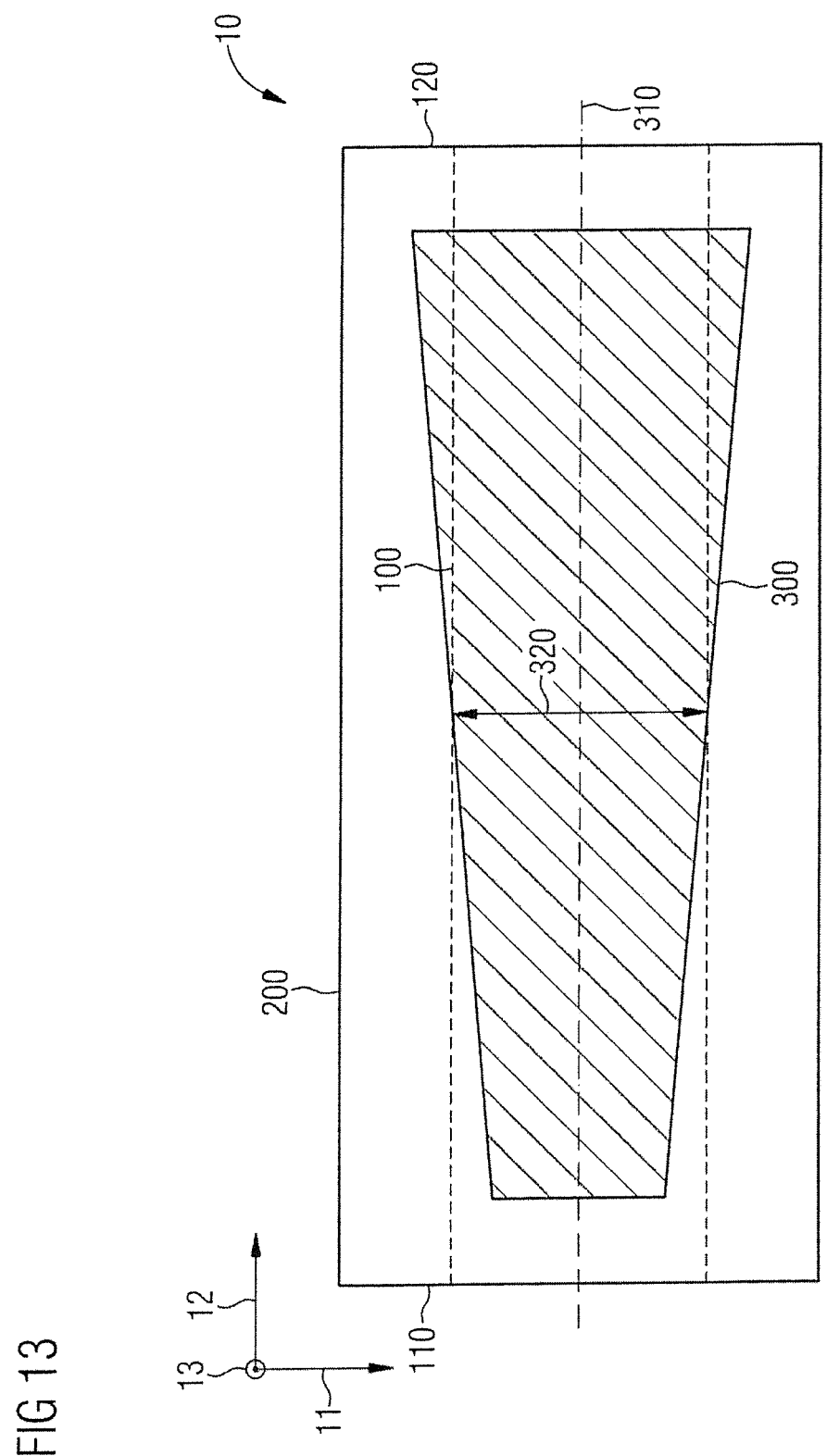
FIG. 13 schematically shows a plan view of the stressed layer in accordance with a sixth example.

FIG. 13 shows, in a schematic illustration, a plan view of the stressed layer 300 in accordance with a sixth example. The sixth example of the stressed layer 300 corresponds to the fifth example shown in FIG. 12 with the difference that the stressed layer 300 in the sixth example shown in FIG. 13 extends not as far as the mirror facet 110 and not as far as the coupling-out facet 120. In a further example, the stressed layer 300 may extend either only to the mirror facet 110 or only to the coupling-out facet 120, while it does not extend to the respective other facet 120, 110.

FIG. 14 shows a schematic sectional side view of the semiconductor laser diode 10 comprising the stressed layer 300 in accordance with a seventh example. In this case, the section proceeds parallel to the longitudinal direction 12 and to the growth direction 13 through the resonator 100 and the stressed layer 300.

The stressed layer 300 is embedded into the metallization layer 280 in the growth direction 13. This means that parts of the metallization layer 280 are arranged below the stressed layer 300 in the growth direction 13 and parts of the metallization layer 280 are arranged above the stressed layer 300 in the growth direction 13. For this purpose, the metallization layer 280 may comprise a plurality of sublayers arranged partly below and partly above the stressed layer 300 in the growth direction 13.

In alternative examples, however, the stressed layer 300 may also be arranged completely below the metallization layer 280 or completely above the metallization layer 280 in the growth direction 13.

The stressed layer 300 comprises a thickness 350 measured in the growth direction 13. In the seventh example shown in FIG. 14, the thickness 350 of the stressed layer 300 is constant in the longitudinal direction 12.

FIG. 15 shows a schematic sectional side view of the semiconductor laser diode 10 comprising the stressed layer 300 in accordance with an eighth example. The eighth example of the stressed layer 300 is formed like the seventh example shown in FIG. 14, with the difference that the thickness 350 of the stressed layer 300 measured in the growth direction 13 in the eighth example shown in FIG. 15 is variable in the longitudinal direction 12. In this case, the thickness 350 increases in the longitudinal direction 12 from the mirror facet 110 in the direction toward the coupling-out facet 120. As a result, the stressed layer 300 in the eighth example shown in FIG. 15 is designed at least partly to compensate for a refractive index variation resulting from a temperature that is variable in the longitudinal direction 12 in the resonator 100 of the semiconductor laser diode 10.

FIG. 16 shows a schematic sectional side view of the semiconductor laser diode 10 comprising the stressed layer 300 in accordance with a ninth example. In the ninth example, the stressed layer 300 is formed as in the eighth example shown in FIG. 15, with the difference that the thickness 350 of the stressed layer 300 measured in the growth direction 13 in the case of the ninth example shown in FIG. 16 decreases in the longitudinal direction 12 from the mirror facet 110 to the coupling-out facet 120. By this means, too, the stressed layer 300 is configured at least partly to compensate for a refractive index profile that forms in the semiconductor layers 230, 240, 250, the refractive index profile being caused by a temperature that is variable in the longitudinal direction 12 in the resonator 100 of the semiconductor laser diode 10.

A further difference between the ninth example shown in FIG. 16 and the eighth example shown in FIG. 15 is that the stressed layer 300 in the ninth example shown in FIG. 16 extends not as far as the mirror facet 110 and not as far as the coupling-out facet 120.

Each of the examples of the stressed layer 300 as shown in FIGS. 14, 15 and 16 may be combined with each of the examples of the stressed layer 300 as shown in FIGS. 6, 9, 10, 11, 12 and 13.

It is expedient for the stressed layer 300 to comprise an electrically conductive material. In this case, an introduction of current into the active region 245 is not impaired, or is impaired only to a small extent, by the stressed layer 300. However, the stressed layer 300 may also comprise an electrically insulating material. By way of example, the stressed layer 300 may comprise a dielectric such as SiN or SiO or a metal such as Au or Ti. If the stressed layer 300 comprises a metal, then the latter may also be oxidized. However, the stressed layer 300 may also comprise an epitaxially deposited layer. It is likewise possible for the stressed layer 300 to comprise benzocyclobutene (BCB), an organic material or a polyimide. The stressed layer 300 may also comprise other materials. The stressed layer 300 may also comprise a combination of a plurality of materials that may be formed, for example, as a layer stack. The stressed layer 300 may be applied, for example, by epitaxial growth, sputtering or vapor deposition.

The stress of the stressed layer 300 may arise, for example, as a result of deposition of the stressed layer at elevated temperature.

The stressed layer 300 may comprise a plurality of sublayers arranged one above another in the growth direction 13 and/or alongside one another in the lateral plane 14. In this case, the individual sublayers may comprise different materials comprising different stresses.

Our laser diodes have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2015 119 226.8, the subject matter of which is incorporated herein by reference.

The invention claimed is:

1. A semiconductor laser diode comprising a layer sequence comprising a plurality of layers arranged one above another in a growth direction,
wherein the semiconductor laser diode comprises a first facet and a second facet between which a resonator extending in a longitudinal direction is formed, the layer sequence comprises an active layer in which an active region is formed, the layer sequence comprises waveguide layers, and the layer sequence comprises a stressed layer arranged above the active layer in the growth direction, said stressed layer being provided for influencing a refractive index profile in the waveguide layers at least to partly compensate for an inhomogeneous variation of a refractive index in the waveguide layers, said inhomogeneous variation being brought about by an inhomogeneous temperature distribution during operation of the semiconductor laser diode, wherein the stressed layer is compressively stressed, and the stressed layer comprises a cutout arranged above the active region in the growth direction.

2. The semiconductor laser diode according to claim 1, wherein the stressed layer is structured in a lateral plane perpendicular to the growth direction.

3. The semiconductor laser diode according to claim 2, wherein the stressed layer is centered above the active region in a transverse direction perpendicular to the growth direction and the longitudinal direction.

4. The semiconductor laser diode according to claim 2, wherein the stressed layer is formed symmetrically with respect to an axis of symmetry parallel to the longitudinal direction.

5. The semiconductor laser diode according to claim 1, wherein the stressed layer is tensile-stressed.

6. The semiconductor laser diode according to claim 5, wherein the stressed layer comprises, in a transverse direction perpendicular to the growth direction and the longitudinal direction, a width that changes in the longitudinal direction.

7. The semiconductor laser diode according to claim 6, wherein the width of the stressed layer increases in the direction toward the coupling-out facet.

8. The semiconductor laser diode according to claim 1, wherein the cutout comprises, in a transverse direction perpendicular to the growth direction and the longitudinal direction, a width that changes in the longitudinal direction.

9. The semiconductor laser diode according to claim 8, wherein the width of the cutout increases in the direction toward the coupling-out facet.

10. The semiconductor laser diode according to claim 1, wherein a thickness of the stressed layer as measured in the growth direction changes in the longitudinal direction.

11. The semiconductor laser diode according to claim 1, wherein the stressed layer extends in the longitudinal direction as far as the first facet and/or as far as the second facet.

12. The semiconductor laser diode according to claim 1, wherein the stressed layer extends in the longitudinal direction not as far as the first facet and/or not as far as the second facet.

13. The semiconductor laser diode according to claim 1, wherein the stressed layer is arranged above a metallization layer in the growth direction.

14. The semiconductor laser diode according to claim 1, wherein a metallization layer is arranged above the stressed layer in the growth direction.

15. The semiconductor laser diode according to claim 1, wherein the stressed layer comprises an electrically conductive material.

16. A semiconductor laser diode, comprising a layer sequence comprising a plurality of layers arranged one above another in a growth direction, wherein the semiconductor laser diode comprises a first facet and a second facet between which a resonator extending in a longitudinal direction is formed, the layer sequence comprises an active layer in which an active region is formed, the layer sequence comprises waveguide layers, and the layer sequence comprises a stressed layer arranged above the active layer in the growth direction, said stressed layer being provided for influencing a refractive index profile in the waveguide layers at least to partly compensate for an inhomogeneous variation of a refractive index in the waveguide layers, said inhomogeneous variation being brought about by an inhomogeneous temperature distribution during operation of the semiconductor laser diode, wherein the stressed layer is arranged above a metallization layer in the growth direction.

17. A semiconductor laser diode comprising a layer sequence comprising a plurality of layers arranged one above another in a growth direction, wherein the semiconductor laser diode comprises a first facet and a second facet between which a resonator extending in a longitudinal direction is formed, the layer sequence comprises an active layer in which an active region is formed, the layer sequence comprises waveguide layers, and the layer sequence comprises a stressed layer arranged above the active layer in the growth direction, said stressed layer being provided for influencing a refractive index profile in the waveguide layers at least to partly compensate for an inhomogeneous variation of a refractive index in the waveguide layers, said inhomogeneous variation being brought about by an inhomogeneous temperature distribution during operation of the semiconductor laser diode, wherein a metallization layer is arranged above the stressed layer in the growth direction.

* * * * *